United States Patent
Yang

(10) Patent No.: US 11,270,760 B2
(45) Date of Patent: Mar. 8, 2022

(54) MEMORY DEVICE WITH IMPROVED BIT LINE PRECHARGE PERFORMANCE AND METHOD OF OPERATING THE MEMORY DEVICE

(71) Applicant: SK hynix Inc., Icheon-si (KR)

(72) Inventor: In Gon Yang, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/856,695

(22) Filed: Apr. 23, 2020

(65) Prior Publication Data

US 2021/0050051 A1 Feb. 18, 2021

(30) Foreign Application Priority Data

Aug. 16, 2019 (KR) .................. 10-2019-0100570

(51) Int. Cl.
| | | |
|---|---|---|
| *G11C 11/40* | (2006.01) | |
| *G11C 11/4094* | (2006.01) | |
| *G11C 11/4091* | (2006.01) | |
| *G11C 11/4076* | (2006.01) | |
| *G11C 11/4074* | (2006.01) | |
| *G11C 11/4093* | (2006.01) | |

(52) U.S. Cl.
CPC ...... *G11C 11/4094* (2013.01); *G11C 11/4074* (2013.01); *G11C 11/4076* (2013.01); *G11C 11/4091* (2013.01); *G11C 11/4093* (2013.01)

(58) Field of Classification Search
CPC ............ G11C 11/4094; G11C 11/4074; G11C 11/4076; G11C 11/4091; G11C 11/4093
See application file for complete search history.

(56) References Cited

U.S. PATENT DOCUMENTS

| 7,532,510 B2* | 5/2009 | Lee ....................... G11C 7/1021 |
| | | 365/185.11 |
| 7,898,871 B2* | 3/2011 | Byeon .................... G11C 16/30 |
| | | 365/185.25 |
| 8,149,635 B2* | 4/2012 | Lee ..................... G11C 16/3454 |
| | | 365/189.16 |

(Continued)

FOREIGN PATENT DOCUMENTS

| KR | 100635205 B1 | 10/2006 |
| KR | 100729351 B1 | 6/2007 |

(Continued)

*Primary Examiner* — Vanthu T Nguyen
(74) *Attorney, Agent, or Firm* — William Park & Associates Ltd.

(57) ABSTRACT

Provided herein may be a memory device and a method of operating the same. The memory device may include a memory cell array, a plurality of page buffer groups, and a program operation controller. The memory cell array may include a plurality of memory cells. The page buffer groups may be coupled to the plurality of memory cells through a plurality of bit line groups, and may be configured to perform bit line precharge operations on the plurality of bit line groups. The program operation controller may be configured to control the plurality of page buffer groups to perform the bit line precharge operations initiated at different time points during a program operation on the plurality of memory cells, and to adjust an interval between initiation time points of the bit line precharge operations depending on a progress of the program operation.

22 Claims, 15 Drawing Sheets

(56) References Cited

U.S. PATENT DOCUMENTS

| | | | |
|---|---|---|---|
| 8,391,077 B2* | 3/2013 | Tanaka | G11C 16/32 |
| | | | 365/185.25 |
| 9,230,659 B2* | 1/2016 | Choi | G11C 16/10 |
| 10,332,602 B2* | 6/2019 | Kim | G11C 16/0483 |
| 2019/0189196 A1* | 6/2019 | Robison | G11C 7/12 |

FOREIGN PATENT DOCUMENTS

| | | |
|---|---|---|
| KR | 101448851 B1 | 10/2014 |
| KR | 1020150001134 A | 1/2015 |

* cited by examiner

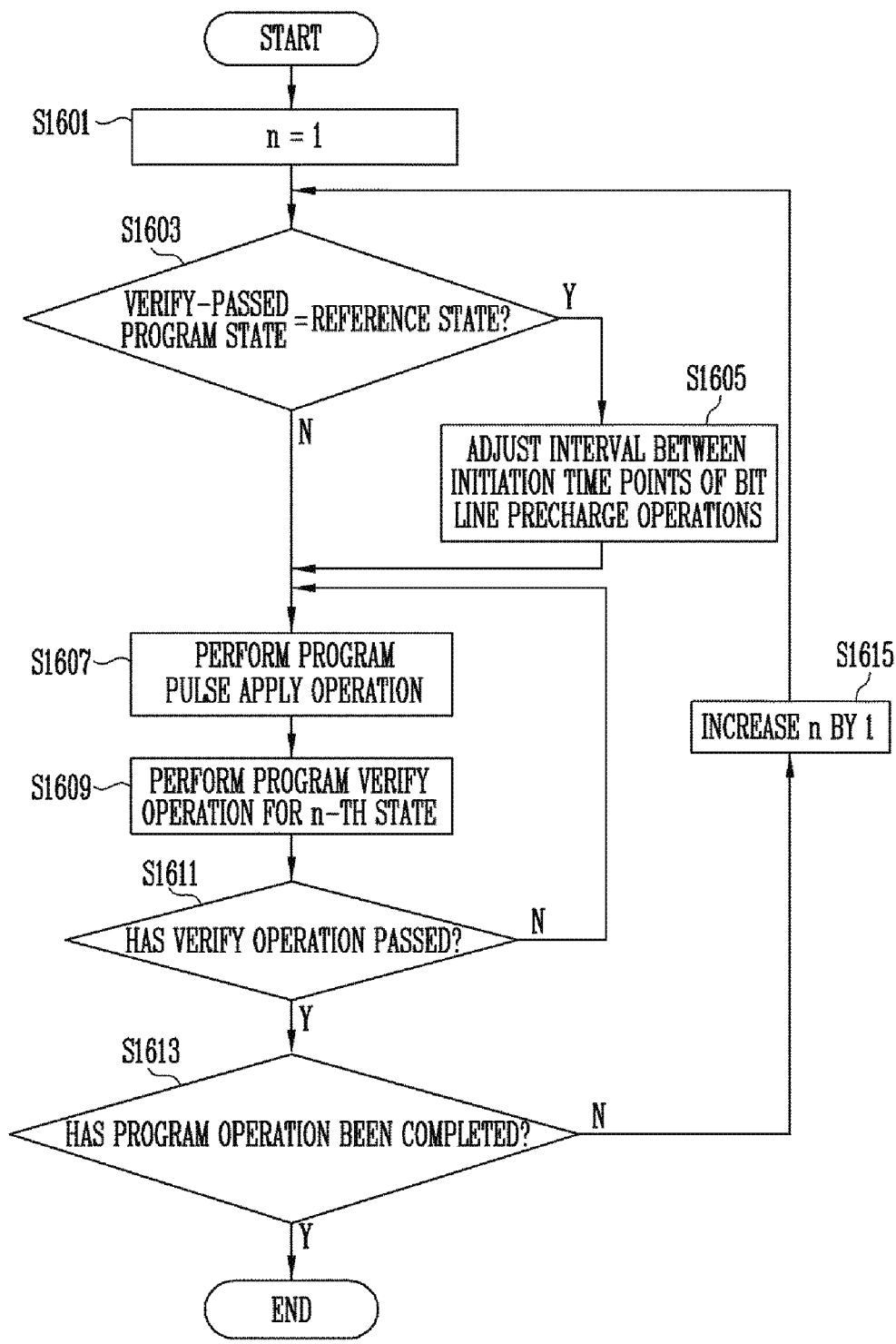

MEMORY DEVICE WITH IMPROVED BIT LINE PRECHARGE PERFORMANCE AND METHOD OF OPERATING THE MEMORY DEVICE

CROSS-REFERENCE TO RELATED APPLICATION

The present application claims priority under 35 U.S.C. § 119(a) to Korean patent application number 10-2019-0100570 filed on Aug. 16, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

A storage device is a device which stores data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a Static Random Access Memory (SRAM) and a Dynamic Random Access Memory (DRAM).

The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

An embodiment of the present disclosure may provide for a memory device. The memory device may include a memory cell array, a plurality of page buffer groups, and a program operation controller. The memory cell array may include a plurality of memory cells. The page buffer groups may be coupled to the plurality of memory cells through a plurality of bit line groups, and may be configured to perform bit line precharge operations on the plurality of bit line groups. The program operation controller may be configured to control the plurality of page buffer groups to perform the bit line precharge operations initiated at different time points during a program operation on the plurality of memory cells, and to adjust an interval between initiation time points of the bit line precharge operations depending on a progress of the program operation.

An embodiment of the present disclosure may provide for a method of operating a memory device, the memory device performing a program operation on a plurality of memory cells. The method may include determining an interval between initiation time points of bit line precharge operations on a plurality of bit line groups coupled to the plurality of memory cells depending on a progress of the program operation, and performing the bit line precharge operations depending on the determined interval between the initiation time points.

BRIEF DESCRIPTION OF THE DRAWINGS

FIG. 16 is a flowchart illustrating the program operation of FIG. 14 according to an embodiment.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to a memory device having improved bit line precharge performance and a method of operating the memory device.

Figure 1:
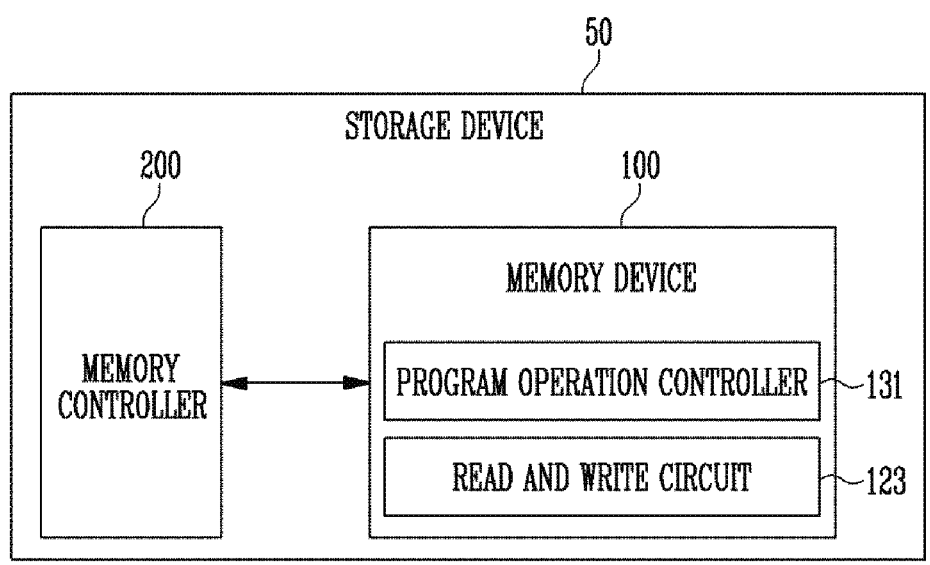
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100 and a memory controller 200 which controls the operation of the memory device. The storage device 50 may be a device which stores data under the control of a host, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a communication scheme with the host. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may include a read and write circuit 123 and a program operation controller 131.

The read and write circuit 123 may include a plurality of page buffer groups coupled to the memory cells of the memory cell array through bit lines. The bit lines may be divided into a plurality of bit line groups respectively corresponding to a plurality of page buffer groups. The plurality of page buffer groups may perform bit line precharge operations of precharging the plurality of bit line groups corresponding thereto, respectively, during a program operation performed on the memory cells.

The program operation controller 131 may control the plurality of page buffer groups so that the respective page buffer groups initiate bit line precharge operations at different time points. The program operation controller 131 may adjust an interval (i.e., time gap) between the initiation time points of the bit line precharge operations performed by respective page buffer groups depending on the progress of the program operation.

The progress of the program operation may be determined to be a highest program state, among program states for which a program verify operation has passed. The highest program state for which the program verify operation has passed will be described later with reference to FIG. 5. Alternatively, the progress of the program operation may be determined to be a program loop count indicating the number of program loops that have been performed, among one or more program loops that are performed during the program operation. The program loops will be described later with reference to FIG. 4.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host and the memory device 100.

In an embodiment, the memory controller 200 may receive data and a logical block address (LBA) from the host, and may translate the logical block address (LBA) into a physical block address (PBA) indicating the address of memory cells which are included in the memory device 100 and in which data is to be stored.

The memory controller 200 may control the memory device 100 so that a program operation, a read operation or an erase operation is performed in response to a request received from the host. During a program operation, the memory controller 200 may provide a write command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a command, an address, and data regardless of whether a request from the host is received, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 using an interleaving scheme to improve operating performance. The interleaving scheme may be an operating manner in which the operating periods of at least two memory devices 100 are caused to overlap each other.

The host may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
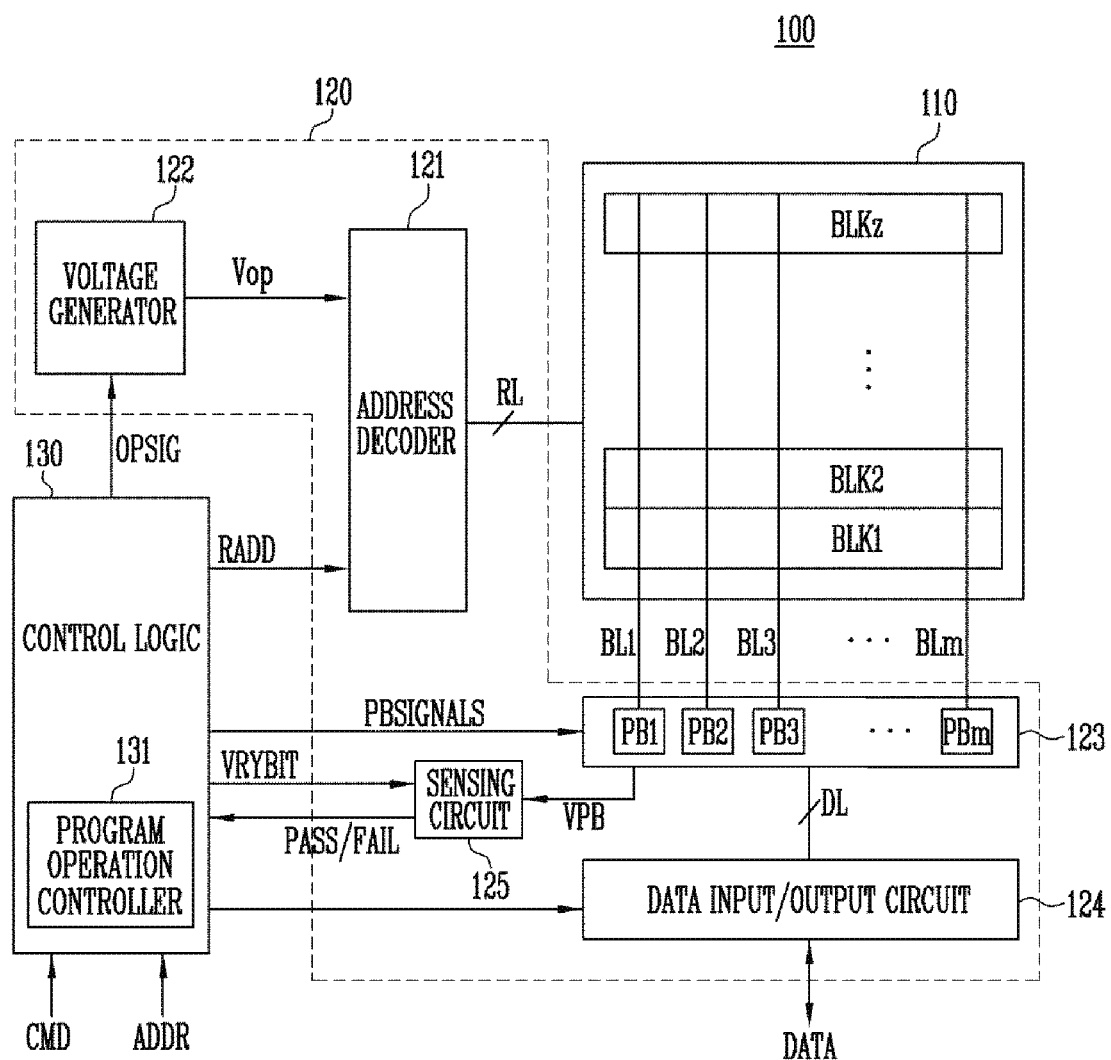
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single physical page. That is, the memory cell array 110 is composed of a plurality of physical pages. In accordance with an embodiment of the present disclosure, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may generate control signals that control the memory cell array 10 to perform a program operation, a read operation, or an erase operation.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

In an embodiment, the row lines RL may be local lines included in local line groups. A local line group may correspond to a single memory block. The local line group may include a drain select line, local word lines, and a source select line.

The address decoder 121 may be operated under the control of the control logic 130. The address decoder 121 receives addresses ADDR from the control logic 130.

The address decoder 121 may decode a block address among the received addresses ADDR. The address decoder 121 selects at least one memory block from among the memory blocks BLK1 to BLKz in response to the decoded block address. The address decoder 121 is configured to decode a row address RADD among the received addresses ADDR. The address decoder 121 may select at least one word line of the selected memory block by applying voltages supplied from the voltage generator 122 to at least one word line WL in response to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

In an embodiment, the read and write circuit 123 may include the plurality of page buffers PB coupled to the memory cells of the memory cell array 110 through the bit lines BL.

The plurality of page buffers PB may be divided into a plurality of page buffer groups. The bit lines BL may be divided into a plurality of bit line groups respectively corresponding to the plurality of page buffer groups. The plurality of page buffer groups may perform bit line precharge operations of precharging the plurality of bit line groups corresponding thereto, respectively, during a program operation performed on the memory cells.

Read and write circuit control signals PBSIGNALS may include a plurality of page buffer control signals respectively corresponding to the plurality of page buffer groups. The plurality of page buffer groups may independently perform bit line precharge operations in response to the plurality of page buffer control signals corresponding thereto, respectively. The coupling relationships between the plurality of page buffer groups and the memory cells will be described with reference to FIG. 9.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control logic 130 may control the peripheral circuit 120 by generating various types of signals in response to the command CMD and the addresses ADDR. For example, the control logic 130 may generate an operation signal OPSIG, a row address RADD, a page buffer control signal PBSIGNALS, and an enable bit VRYBIT in response to the command CMD and the addresses ADDR. The control logic 130 may output the operation signal OPSIG to the voltage generator 122, output the row address RADD to the address decoder 121, output the page buffer control signal PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the control logic 130 may include a program operation controller 131.

The program operation controller 131 may control the plurality of page buffer groups included in the read and write circuit 123 so that the respective page buffer groups initiate bit line precharge operations at different time points.

For example, the program operation controller 131 may provide the read and write circuit control signals PBSIGNALS, including the plurality of page buffer control signals respectively corresponding to the plurality of page buffer groups, to the read and write circuit 123. The plurality of page buffer groups may independently perform bit line precharge operations in response to the plurality of page buffer control signals corresponding thereto, respectively.

The program operation controller 131 may adjust an interval between the initiation time points of the bit line precharge operations performed by respective page buffer groups depending on the progress of the program operation.

The progress of the program operation may be determined to be a highest program state, among program states for which a program verify operation has passed. Alternatively, the progress of the program operation may be determined to be a program loop count indicating the number of program loops that have been performed, among one or more program loops that are performed during the program operation.

Figure 3:
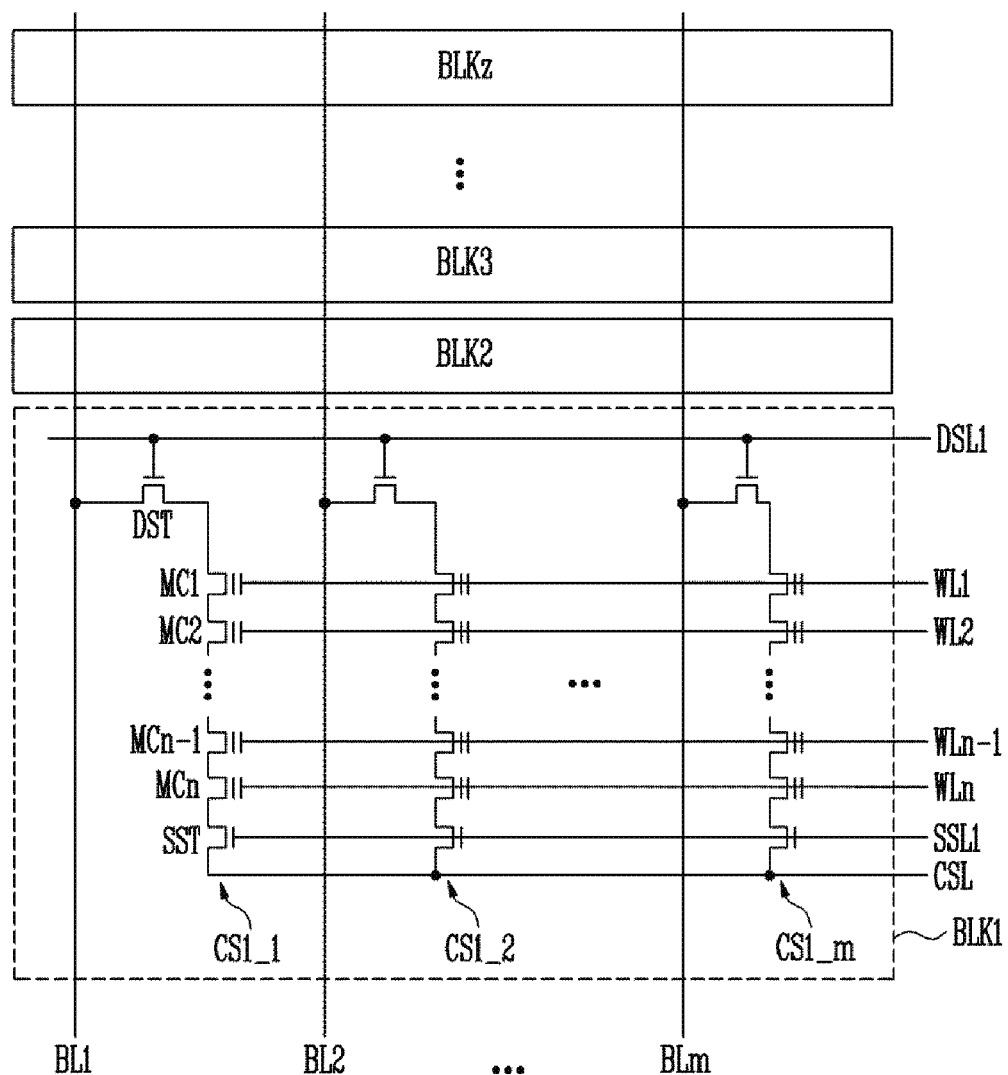
FIG. 3 is a diagram illustrating a memory cell array of FIG. 2.

FIG. 3 is a diagram illustrating the memory cell array of FIG. 2.

Referring to FIG. 3, the first to z-th memory blocks BLK1 to BLKz are coupled in common to the first to m-th bit lines BL1 to BLm. In FIG. 3, for convenience of description, elements included in the first memory block BLK1, among the plurality of memory blocks BLK1 to BLKz, are illustrated, and illustration of elements included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_m (where m is a positive integer). The first to m-th cell strings CS1_1 to CS1_m are respectively coupled to the first to m-th bit lines BL1 to BLm. Each of the first to m-th cell strings CS1_1 to CS1_m may include a drain select transistor DST, a plurality of memory cells MC1 to MCn (where n is a positive integer) which are coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are coupled to first to n-th word lines WL1 to WLn, respectively. A gate terminal of the source select transistor SST included in each of the first to m-th cell strings CS1_1 to CS1_m is coupled to a source select line SSL1.

For convenience of description, the structure of each cell string will be described based on the first cell string CS1_1, among the plurality of cell strings CS1_1 to CS1_m. However, it will be understood that each of the remaining cell strings CS1_2 to CS1_m is configured in the same manner as the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn may be coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
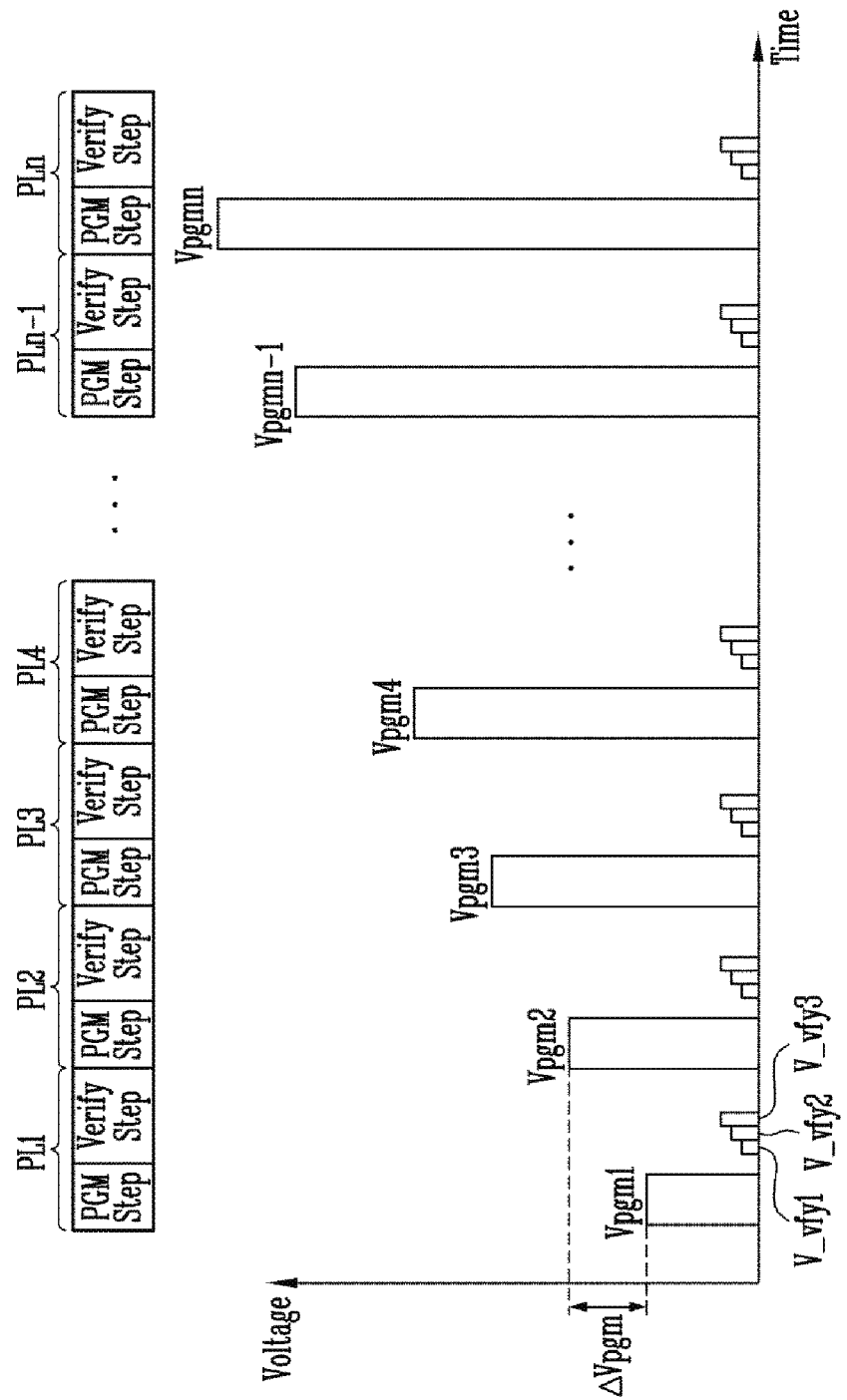
FIG. 4 is a diagram illustrating a program operation according to an embodiment.

FIG. 4 is a diagram illustrating a program operation according to an embodiment.

Referring to FIG. 4, the program operation may include a plurality of program loops PL1 to PLn. The memory device may perform a program operation so that each of selected memory cells has any one of a plurality of program states by performing the plurality of program loops PL1 to PLn.

Each of the plurality of program loops PL1 to PLn may include a program voltage apply step (PGM step) of applying a program voltage and a verify step of verifying whether the memory cells have been programmed by applying verify voltages.

At the program voltage apply step, a program voltage apply operation of applying the program voltage to a selected word line coupled to the selected memory cells may be performed. Each of the selected memory cells may be programmed to a program state corresponding to any one of first to n-th states (where n is a natural number) through the program voltage apply operation.

In an embodiment, the program voltage may be determined based on an incremental step pulse programming (ISPP) method. That is, the level of the program voltage may be increased or decreased by a predetermined voltage increment (i.e., a step voltage) in a step-by-step manner while the program loops are repeated. The number of applications of program voltages used in respective program loops, the voltage levels of the program voltages, voltage application times, etc. may be determined in various forms under the control of the memory controller.

A pass voltage may be applied to the remaining word lines, that is, unselected word lines, other than the selected word line. In an embodiment, pass voltages having the same level may be applied to the unselected word lines. In an embodiment, the pass voltage may have different levels depending on the locations of word lines.

A ground voltage may be applied as a program permission voltage to the selected bit lines coupled to the memory cells to be programmed. A program inhibition voltage may be applied to the unselected bit lines, which are bit lines coupled to memory cells other than the memory cells to be programmed.

The memory device may apply the verify voltages to the selected word line and apply a verify pass voltage to the unselected word lines at the program verify step. The memory device may sense voltages or currents output through the bit lines to which the memory cells coupled to the selected word line are respectively coupled, and may determine whether the verify step has passed or failed based on the results of sensing.

At the verify step, a program verify operation may be performed for at least one of the first to n-th program states. For example, when memory cells to be programmed to a k-th state (where k is a natural number that is equal to or greater than 1 and is less than or equal to n) are read as off-cells through the verify voltage corresponding to the k-th state, a program verify operation for the k-th state may pass.

In FIG. 4, when the selected memory cells are multi-level cells (MLC), each storing two data bits, the selected memory cells may be programmed to any one of an erased state and first to third program states. The number of data bits stored in one memory cell is not limited to the present embodiments.

When the first program loop PL1 is performed, a first program voltage Vpgm1 is applied, and thereafter the first to third verify voltages V_vfy1 to V_vfy3 are sequentially applied so as to verify the program states of the plurality of memory cells. Here, memory cells, the target states of which are the first program state, may be verified using the first verify voltage V_vfy1, memory cells, the target states of which are the second program state, may be verified using the second verify voltage V_vfy2, and memory cells, the target states of which are the third program state, may be verified using the third verify voltage V_vfy3. The number of verify voltages is not limited to the present embodiments.

The memory cells which have passed verification through respective verify voltages V_vfy1 to V_vfy3 may be determined to have the target states, and may then be program inhibited in the second program loop PL2. A program inhibition voltage may be applied to the bit lines coupled to the program-inhibited memory cells. In the second program loop PL2, a second program voltage Vpgm2 higher than the first program voltage Vpgm1 by a unit voltage ΔVpgm is applied to the selected word line.

Thereafter, a verify operation is performed in the same way as the verify operation in the first program loop PL1. In an example, the term "verification pass" indicates that each memory cell is read as an off-cell through the corresponding verify voltage.

As described above, when the memory device programs multi-level cells (MLC), the memory device verifies the memory cells having respective program states as target states using the first to third verify voltages V_vfy1 to V_vfy3.

In various embodiments, when the program operation is not completed within a preset number of program loops, the program operation may fail. When the program operation is completed within a preset number of program loops, the program operation may pass. Whether the program operation is completed may be determined depending on whether the selected memory cells have passed all program verify operations.

In an embodiment, one or more program loops may be performed during the program operation. The progress of the program operation may indicate program loops which have been completed up to a current time, among all program loops, during the program operation. That is, the progress of the program operation may be a program loop count indicating the number of program loops that have been performed, among one or more program loops.

Figure 5:
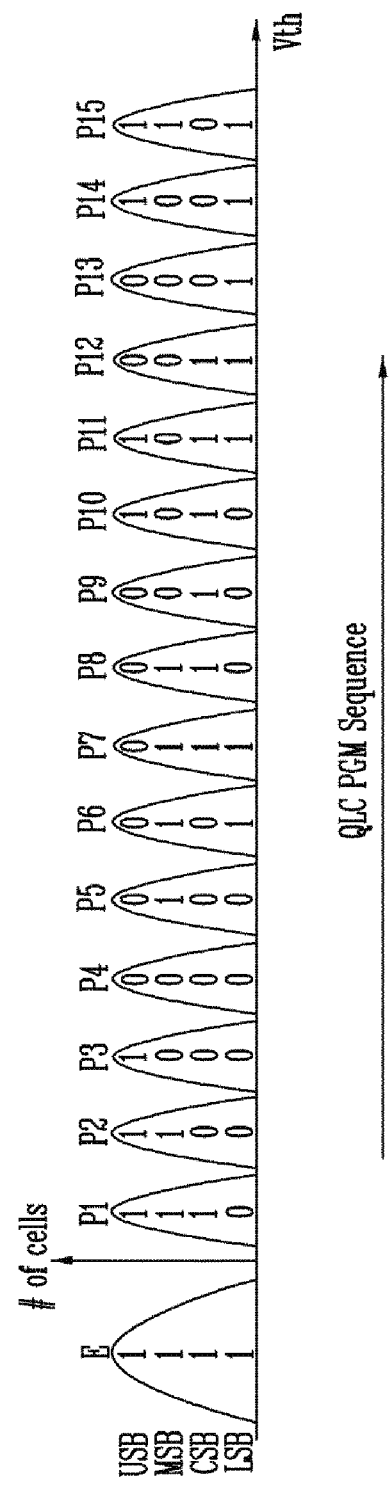
FIG. 5 is a diagram illustrating a progress sequence of a program operation according to an embodiment.

FIG. 5 is a diagram illustrating a progress sequence of a program operation according to an embodiment.

Referring to FIG. 5, a description will be made on the assumption that each memory cell is a quad-level cell (QLC) which stores four data bits. Each memory cell may be programmed to any one of an erased state E and first to fifteenth program states P1 to P15.

The memory cell may store logical data corresponding to any one of the erased state E and the plurality of program states P1 to P15. The logical data may include Upper Significant Bit (USB) page data, Most Significant Bit (MSB) page data, Central Significant Bit (CSB) page data, and Least Significant Bit (LSB) page data.

In FIG. 5, the erased state E and the first to fifteenth program states P1 to P15 may correspond to pieces of logical data '1111', '1110', '1100', '1000', '0000', 0100', '0101', '0111', '0110', '0010', '1010', '1011', '0011', '0001', '1001' and '1101', respectively. The pieces of logical data corresponding to respective states are not limited to the present embodiments.

The program operation may be sequentially performed in a sequence from the first program state P1 to the fifteenth program state P15. A program verify operation may also be sequentially performed in a sequence from a program verify operation for the first program state P1 to a program verify operation for the fifteenth program state P15.

The progress of the program operation may indicate a point up to which the program operation has been completed within a range from a start point to an end point. In an embodiment, the progress of the program operation may be a highest program state, among states for which the program verify operation has passed.

For example, when program verify operations for the first to fifth program states P1 to P5 have passed and program verify operations for the remaining program states P6 to P15 have failed, the progress of the program operation may correspond to the fifth program state P5. It can be seen that, by means of the progress of the program operation, the program operation for the first to fifth program states P1 to P5, among all of the program states P1 to P15, has been completed.

Figure 6:
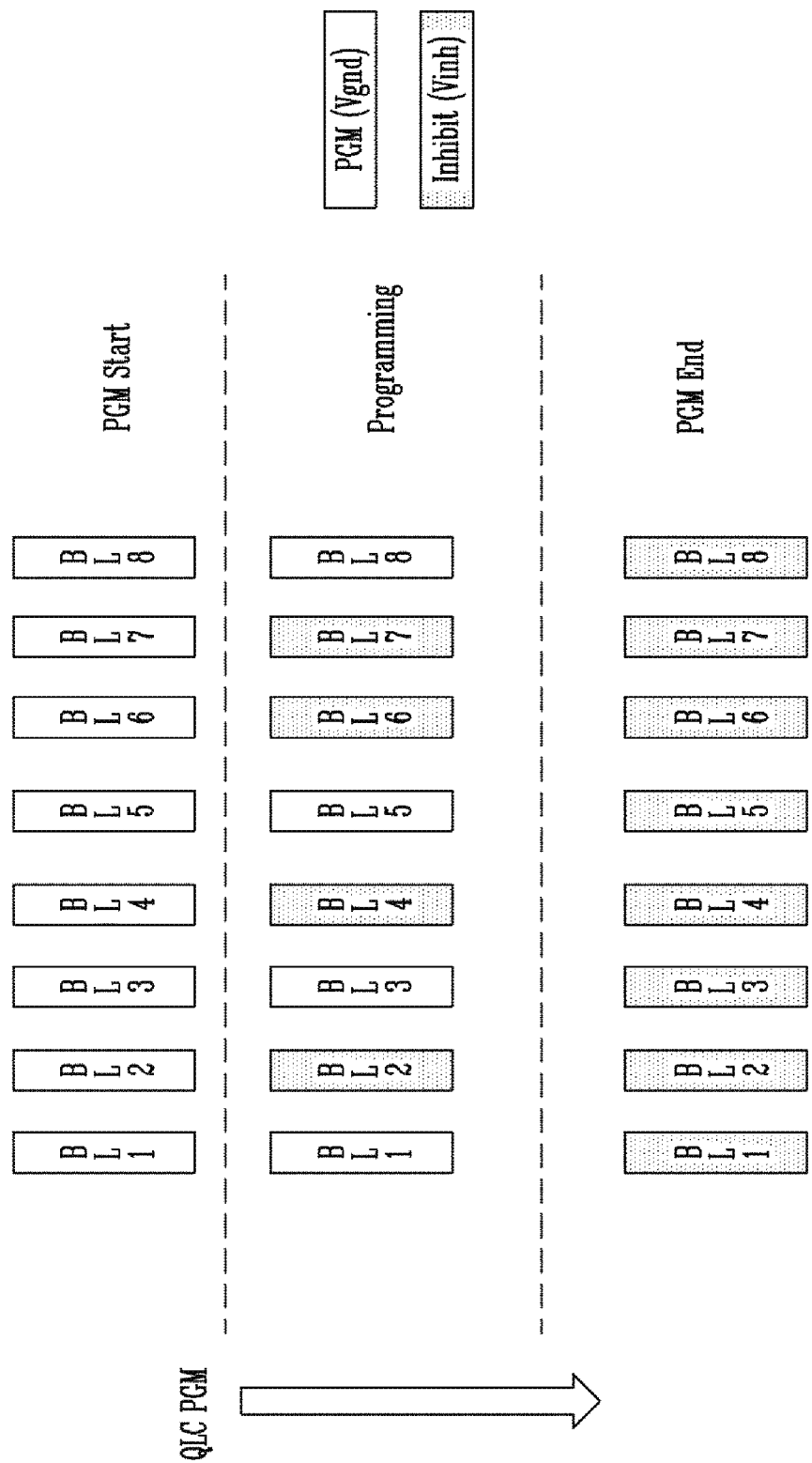
FIG. 6 is a diagram for explaining bit line loading.

FIG. 6 is a diagram for explaining bit line loading.

Referring to FIG. 6, a program permission voltage may be applied to bit lines coupled to cells to be programmed. In an embodiment, the program permission voltage may be a ground voltage Vgnd.

A program inhibition voltage Vinh may be applied to bit lines coupled to cells for which programming has been completed. In an embodiment, the program inhibition voltage may be a supply voltage.

At a start point of the program operation PGM Start, first to eighth bit lines BL1 to BL8 may be bit lines coupled to cells to be programmed.

While the program operation is performed (Programming), the first, third, fifth, and eighth bit lines BL1, BL3, BL5, and BL8 may be bit lines coupled to cells to be programmed. The second, fourth, sixth, and seventh bit lines BL2, BL4, BL6, and BL7 may be bit lines coupled to cells for which programming has been completed.

At an end point of the program operation PGM End, the first to eighth bit lines BL1 to BL8 may be bit lines coupled to cells for which programming has been completed.

Bit line loading may occur due to capacitance between adjacent bit lines. The bit line loading may be a burden required to precharge the bit lines to a certain level. Thus, a value of the bit line loading may be measured in various ways. In an embodiment, the bit line loading may be caused by the capacitance between the adjacent bit lines and may be proportional to the capacitance. Thus, the value of the bit line loading may be measured by a value of the capacitance. In an embodiment, the value of the bit line loading may be measured by a time to precharge the bit lines to a certain level when the other conditions are same. In an embodiment, the value of the bit line loading may be measured by power required to precharge the bit lines to a certain level when the other conditions are same. In an embodiment, the value of the bit line loading may be used as a relative measure for comparing. Thus, the value of the bit line loading does not have specific unit.

The magnitude of the capacitance may be proportional to the difference between voltages applied to the adjacent bit lines. Therefore, when the voltage difference between the adjacent bit lines is large, bit line loading may have a large value, whereas when the voltage difference between the adjacent bit lines is small, bit line loading may have a small value.

As a bit line loading value is larger, a longer time may be required in order to perform a bit line precharge operation of increasing the potentials of the bit lines to a certain level. As a bit line loading value is smaller, a shorter time may be required in order to perform the bit line precharge operation.

In FIG. 6, since the voltages of the adjacent bit lines at the start point of the program operation PGM Start are identical to each other and are the ground voltage Vgnd, which is the program permission voltage, a bit line loading value may be small. Therefore, during the bit line precharge operation, a shorter time may be required.

While the program operation is performed (Programming), the bit lines coupled to the cells to be programmed and the bit lines coupled to the cells for which programming has been completed may be adjacent to each other. Therefore, since the voltages of the adjacent bit lines are different from each other, a voltage difference may occur, and bit line loading may be large. Therefore, a longer time may be required for the bit line precharge operation.

Since the voltages of the adjacent bit lines at the end point of the program operation PGM End are equal to each other as the program inhibition voltage Vinh, bit line loading may be small. Therefore, a shorter time may be required for the bit line precharge operation.

Figure 7:
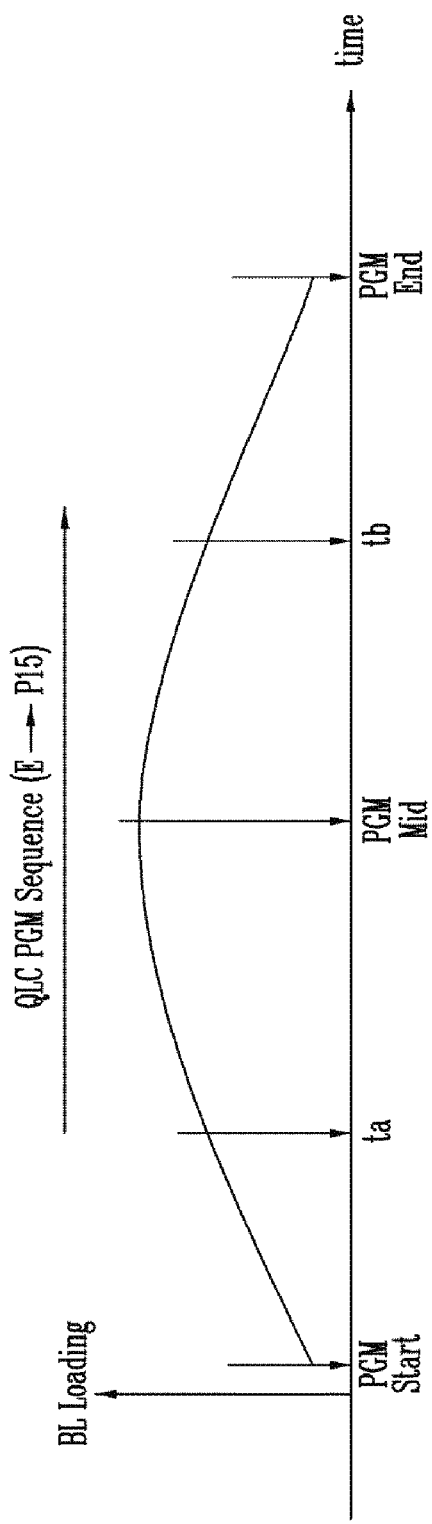
FIG. 7 is a diagram for explaining a change in bit line loading depending on the progress of a program operation.

FIG. 7 is a diagram for explaining a change in bit line loading depending on the progress of a program operation.

Referring to FIG. 7, a horizontal axis of the graph may indicate time, and a vertical axis of the graph may indicate bit line loading.

At a start point of a program operation PGM Start, bit lines may be bit lines coupled to cells to be programmed. Therefore, since there are many cases where the voltages of adjacent bit lines are equal to each other as a program permission voltage at the start point of the program operation PGM Start, bit line loading may be small.

At a middle point of the program operation PGM Mid, the number of bit lines coupled to cells to be programmed may be similar to the number of bit lines coupled to cells for which programming has been completed. Therefore, in the largest number of cases, the voltages of the adjacent bit lines are different from each other as the program permission voltage and the program inhibition voltage, respectively, and thus bit line loading may be the largest.

At an end point of the program operation PGM End, bit lines may be bit lines coupled to cells for which programming has been completed. Therefore, since there are many cases where the voltages of adjacent bit lines are equal to each other as the program inhibition voltage at the end point of the program operation PGM End, bit line loading may be small.

While the program operation is performed, the number of bit lines coupled to cells to be programmed, among all bit lines, may decrease, and the number of bit lines coupled to cells for which programming has been completed may increase.

Therefore, since the number of cases where the voltages of adjacent bit lines are different from each other as the program permission voltage and the program inhibition voltage, respectively, may increase in a range from the start point of the program operation PGM Start to the middle point of the program operation PGM Mid, bit line loading may increase. Since the number of cases where the voltages of adjacent bit lines are different from each other decreases in a range from the middle point of the program operation (PGM Mid) to the end point of the program operation (PGM End), bit line loading may decrease.

In an embodiment, the memory device may predict a change in bit line loading based on the progress of the program operation. The memory device may determine the time required for the bit line precharge operation depending on the change in bit line loading. Therefore, the memory device may set the time required for the bit line precharge operation to different times depending on the progress of the program operation.

For example, the memory device may set the time required for the bit line precharge operation when the progress of the program operation exists between a point ta and a point tb to a time longer than that when the progress of the program operation exists between the start point of the program operation PGM Start and the point ta. The memory device may set the time required for the bit line precharge operation when the progress of the program operation exists between the point ta and the point tb to a time longer than that when the progress of the program operation exists between the point tb and the end point of the program operation PGM End.

As will be described later with reference to FIGS. 12 and 13, the memory device may adjust the interval between initiation time points of respective bit line precharge operations of page buffer groups in order to set the time required for the entire bit line precharge operation to different times. For example, the memory device may increase the interval between the initiation time points of respective bit line precharge operations of the page buffer groups in order to set the time required for the entire bit line precharge operation to a longer time. The memory device may decrease the interval between the initiation time points of respective bit line precharge operations of the page buffer groups in order to set the time required for the entire bit line precharge operation to a shorter time.

The memory device may adjust the interval between the initiation time points of respective bit line precharge operations of the plurality of page buffer groups based on the progress of the program operation and the results of a comparison between values at one or more reference points.

In FIG. 7, the points ta and tb may be reference points based on which the time required for the corresponding bit line precharge operation is set to different times.

In an embodiment, when the progress of the program operation is a program loop count, described above with reference to FIG. 4, the reference points may correspond to reference values. For example, assuming that a program loop is performed 100 times during the program operation, a reference value at the point ta may be 25 (times), a reference value at the middle point of the program operation PGM Mid may be 50 (times), and a reference value at the point tb may be 75 (times).

When the program loop count is equal to or greater than 25 that is the reference value at the point ta, the memory device may increase the interval between the initiation time points of respective bit line precharge operations of the page buffer groups in order to set the time required for the entire bit line precharge operation to a long time. When the program loop count is equal to or greater than 75 that is the reference value at the point tb, the memory device may decrease the interval between the initiation time points of respective bit line precharge operations of the page buffer groups in order to set the time required for the entire bit line precharge operation to a short time.

In an embodiment, when the progress of the program operation is the highest program state for which the program verify operation, described above with reference to FIG. 5, has passed, the reference point may correspond to a reference state. For example, when the program operation starts at the erased state E and is then performed up to a fifteenth program state P15, the reference state at the point ta may be a third program state P3, the reference state at the middle point of the program operation PGM Mid may be a seventh state P7, and the reference state at the point tb may be an eleventh program state P11.

When the highest program state for which the program verify operation has passed is equal to or higher than the third program state P3 that is the reference state at the point ta, the memory device may increase the interval between the initiation time points of respective bit line precharge operations of the page buffer groups in order to set the time required for the entire bit line precharge operation to a longer time. When the highest program state for which the program verify operation has passed is equal to or higher than the eleventh program state P11 that is the reference state at the point tb, the memory device may decrease the interval between the initiation time points of respective bit line precharge operations of the page buffer groups in order to set the time required for the entire bit line precharge operation to a shorter time.

In various embodiments, the program operation may be divided into a plurality of periods depending on the plurality of points. The memory device may set times required for bit line precharge operations in respective periods to different times based on the bit line loading values of respective periods. The memory device may adjust the interval between the initiation time points of bit line precharge operations in respective periods based on the bit line loading values of respective periods.

In accordance with an embodiment of the present disclosure, the time required for the entire bit line precharge operation may be set in consideration of bit line loading depending on the progress of the program operation. For example, in order to set the time required for the entire bit line precharge operation, the interval between the initiation time points of respective bit line precharge operations performed by the plurality of page buffer groups may be adjusted.

In this way, the time required for the bit line precharge operation during a period in which bit line loading is small may be shortened, and the speed of the entire program operation may be improved.

Figure 8:
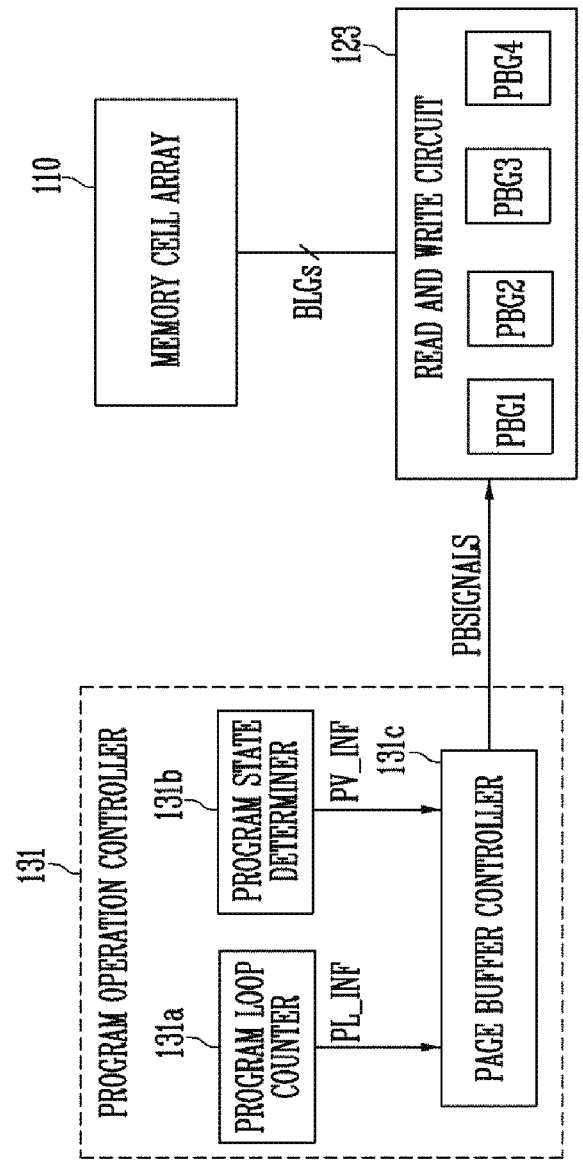
FIG. 8 is a diagram illustrating the configuration and operation of a memory device according to an embodiment.

FIG. 8 is a diagram illustrating the configuration and operation of a memory device according to an embodiment.

Referring to FIG. 8, a memory cell array 110 may include a plurality of memory cells. A read and write circuit 123 may include a plurality of page buffer groups PBG1 to PBG4.

The plurality of memory cells may be coupled to the plurality of page buffer groups PBG1 to PBG4 of the read and write circuit 123 through a plurality of bit line groups BLGs.

The plurality of page buffer groups PBG1 to PBG4 may respectively perform bit line precharge operations of precharging the corresponding bit line groups BLGs. The page buffer groups PBG1 to PBG4 may perform respective bit line precharge operations in response to a plurality of page buffer control signals included in read and write circuit control signals PBSIGNALS. For example, each page buffer group may perform a bit line precharge operation during a period in which the corresponding page buffer control signal is activated.

The plurality of page buffer groups PBG1 to PBG4 may initiate bit line precharge operations at different time points. The lengths of the periods of the bit line precharge operations performed by respective page buffer groups PBG1 to PBG4 may differ from each other. Alternatively, the lengths of the periods of the bit line precharge operations performed by respective page buffer groups PBG1 to PBG4 may be equal to each other.

The program operation controller 131 may include a program loop counter 131a, a program state determiner 131b, and a page buffer controller 131c.

The program loop counter 131a may count the number of program loops which have been performed, among one or more program loops which are to be performed during a program operation. The program loop counter 131a may generate program loop count information PL_INF indicating a program loop count that is the number of program loops which have been performed. The program loop counter 131a may provide the generated program loop count information PL_INF to the page buffer controller 131c.

The program state determiner 131b may determine the highest program state, among program states for which a program verify operation has passed, during the program operation. The program state determiner 131b may generate program state information PV_INF indicating the highest program state, among the program states for which the program verify operation has passed. The program state determiner 131b may provide the generated program state information PV_INF to the page buffer controller 131c.

The page buffer controller 131c may provide the read and write circuit control signals PBSIGNALS to the read and write circuit 123. The read and write circuit control signals PBSIGNALS may include a plurality of page buffer control signals respectively corresponding to the plurality of page buffer groups PBG1 to PBG4.

The page buffer controller 131c may adjust the lengths of the periods of the bit line precharge operations of the page buffer groups in response to the page buffer control signals. The page buffer controller 131c may adjust the initiation time points of the bit line precharge operations of the page buffer groups in response to the page buffer control signals. For example, the page buffer controller 131c may apply an activated page buffer control signal to the page buffer group so that the corresponding page buffer group initiates the bit line precharge operation. The page buffer controller 131c may apply a deactivated buffer control signal to the page buffer group so that the corresponding page buffer group terminates the bit line precharge operation.

The page buffer controller 131c may control the plurality of page buffer groups PBG1 to PBG4 so that the page buffer groups PBG1 to PBG4 respectively perform bit line precharge operations in response to the plurality of page buffer control signals. The page buffer controller 131c may control the plurality of page buffer groups PBG1 to PBG4 so that the page buffer groups PBG1 to PBG4 respectively initiate bit line precharge operations at different time points.

In an embodiment, the page buffer controller 131c may adjust the interval between the initiation time points of the bit line precharge operations performed by respective page buffer groups PBG1 to PBG4 depending on the progress of the program operation. For example, the page buffer controller 131c may adjust the interval between time points at which a plurality of page buffer control signals that are applied to the respective page buffer groups PBG1 to PBG4 are activated depending on the progress of the program operation.

In an embodiment, the page buffer controller 131c may determine the progress of the program operation based on the program loop count contained in the program loop count information PL_INF.

The page buffer controller 131c may adjust the interval between the initiation time points of the bit line precharge operations based on the results of a comparison between the program loop count and one or more reference values. The page buffer controller 131c may increase the interval between the initiation time points of the bit line precharge operations when the program loop count is equal to or greater than a first reference value. The page buffer controller 131c may decrease the interval between the initiation time points of the bit line precharge operations when the program loop count is equal to or greater than a second reference value. The second reference value may be different from the first reference value. The second reference value may be greater than the first reference value.

In an embodiment, the page buffer controller 131c may determine the progress of the program operation based on the highest program state for which a program verify operation has passed and which is contained in the program state information PV_INF.

The page buffer controller 131c may adjust the interval between the initiation time points of the bit line precharge operations based on the results of a comparison between the highest program state and one or more reference states. The page buffer controller 131c may increase the interval between the initiation time points of the bit line precharge operations when the highest program state is equal to or higher than a first reference state. The page buffer controller 131c may decrease the interval between the initiation time points of the bit line precharge operations when the highest program state is equal to or higher than a second reference state. The second reference state may be different from the first reference state. The second reference state may be higher than the first reference state.

Figure 9:
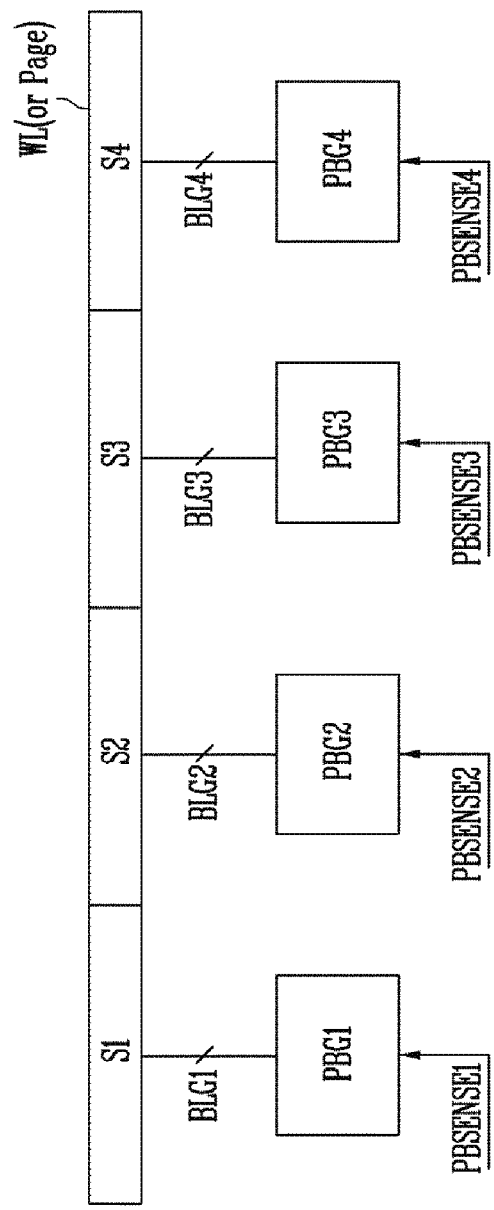
FIG. 9 is a diagram illustrating a read and write circuit of FIG. 8.

FIG. 9 is a diagram illustrating the read and write circuit of FIG. 8.

Referring to FIG. 9, the read and write circuit may include first to fourth page buffer groups PBG1 to PBG4. The number of page buffer groups included in the read and write circuit is not limited to the present embodiments.

The unit of data stored in memory cells coupled to a single word line WL may be a page. Each page may include first to fourth sub-pages S1 to S4. The number of sub-pages included in each page is not limited to the present embodiments.

Memory cells constituting each sub-page may be coupled to the corresponding page buffer group through the corresponding bit line group. For example, memory cells constituting a first sub-page S1 may be coupled to the first page buffer group PBG1 through a first bit line group BLG1. Memory cells constituting a second sub-page S2 may be coupled to the second page buffer group PBG2 through a second bit line group BLG2. Memory cells constituting a third sub-page S3 may be coupled to the third page buffer group PBG3 through a third bit line group BLG3. Memory cells constituting a fourth sub-page S4 may be coupled to the fourth page buffer group PBG4 through a fourth bit line group BLG4.

Each page buffer group may perform a bit line precharge operation of precharging the bit line group coupled thereto in response to an applied page buffer control signal. When an activated page buffer control signal is applied, each page buffer group may initiate a bit line precharge operation, whereas when a deactivated page buffer control signal is applied, each page buffer group may terminate the bit line precharge operation.

For example, the first page buffer group PBG1 may perform a bit line precharge operation of precharging the first bit line group BLG1 in response to a first page buffer control signal PBSENSE1. Similarly, the second to fourth page buffer groups PBG2 to PBG4 may respectively perform bit line precharge operations of precharging the corresponding second to fourth bit line groups BLG2 to BLG4 in response to the corresponding second to fourth page buffer control signals PBSENSE2 to PBSENSE4.

Figure 10:
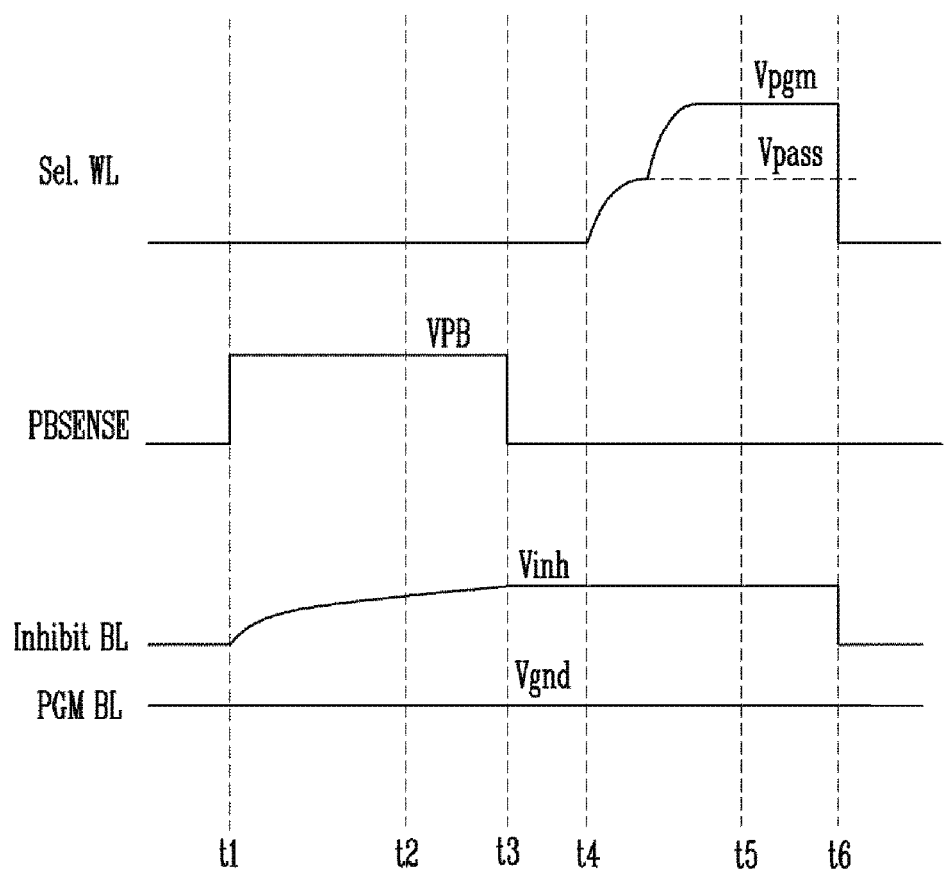
FIG. 10 is a diagram illustrating a program voltage apply step of FIG. 4.

FIG. 10 is a diagram illustrating the program voltage apply step of FIG. 4.

Referring to FIG. 10, the program voltage apply step may include a bit line precharge operation, a bit line floating operation, and a program voltage apply operation.

During a period from a time point t1 to a time point t3, a bit line precharge operation of precharging the potential of the corresponding bit line to a certain level may be performed to perform a program operation.

During the period from the time point t1 to the time point t3, a page buffer control signal PBSENSE may be activated. For example, at the time point t1, the page buffer control signal PBSENSE may make a transition from a low level to the level of a control voltage VPB and then be activated. At the time point t3, the page buffer control signal PBSENSE may make a transition from the level of the control voltage VPB to a low level and then be deactivated.

In an embodiment, when the activated page buffer control signal PBSENSE is applied to the page buffer group, the page buffer group may initiate the bit line precharge operation. When the deactivated page buffer control signal PBSENSE is applied to the page buffer group, the page buffer group may terminate the bit line precharge operation.

During the activation of the page buffer control signal PBSENSE, the bit line precharge operation may be performed while a program permission voltage Vgnd or a program inhibition voltage Vinh is applied to the bit lines.

For example, during the activation of the page buffer control signal PBSENSE, the program permission voltage Vgnd may be applied to a bit line PGM BL coupled to a cell to be programmed. In an embodiment, the program permission voltage Vgnd may be a ground voltage. The program inhibition voltage Vinh may be applied to a bit line coupled to a program-inhibited cell, that is, Inhibit BL. In an embodiment, the program inhibition voltage Vinh may be a supply voltage.

At the time point t3, the potential of the bit line PGM BL may be set to the ground voltage, and the potential of the bit line Inhibit BL may be set to the program inhibition voltage Vinh.

The bit line floating operation of maintaining the potential of the precharged bit line may be performed during a period from the time point t3 to a time point t6.

During the period from the time point t3 to the time point t6, the page buffer control signal PBSENSE may be deactivated. For example, at the time point t3, the page buffer control signal PBSENSE may make a transition from the level of the control voltage VPB to a low level and then be deactivated.

When the page buffer control signal PBSENSE is deactivated, the bit line may float, and the potential of the bit line may be maintained at the precharged voltage level.

During the period from the time point t3 to the time point t6, the potential of the bit line PGM BL may be maintained at the ground voltage, and the potential of the bit line Inhibit BL may be maintained at the program inhibition voltage Vinh.

During a period from a time point t4 to the time point t6, the program voltage Vpgm apply operation of applying a program voltage Vpgm to a selected word line Sel.WL may be performed. For example, a pass voltage Vpass may be first applied to the selected word line Sel.WL and an unselected word line (not illustrated). Thereafter, the program voltage Vpgm may be applied to the selected word line Sel.WL.

During the period from the time point t4 to the time point t6, the potential of the selected word line Sel.WL may increase up to the pass voltage Vpass, and may then increase up to the program voltage Vpgm. The potential of the unselected word line may increase up to the pass voltage Vpass, and may then be maintained at the pass voltage Vpass.

In FIG. 10, whether to perform a program operation on the corresponding memory cell may be determined depending on the difference between the program voltage Vpgm applied to the selected word line and a bit line voltage applied to the bit line.

The potential difference between the program permission voltage Vgnd and the program voltage Vpgm may be sufficient to perform a program operation. Therefore, the memory cell coupled to the bit line PGM BL precharged to the program permission voltage Vgnd may be programmed.

The potential difference between the program inhibition voltage Vinh and the program voltage Vpgm may be insufficient to perform a program operation. Therefore, the memory cell coupled to the bit line Inhibit BL precharged to the program inhibition voltage Vinh may not be programmed.

Figure 11:
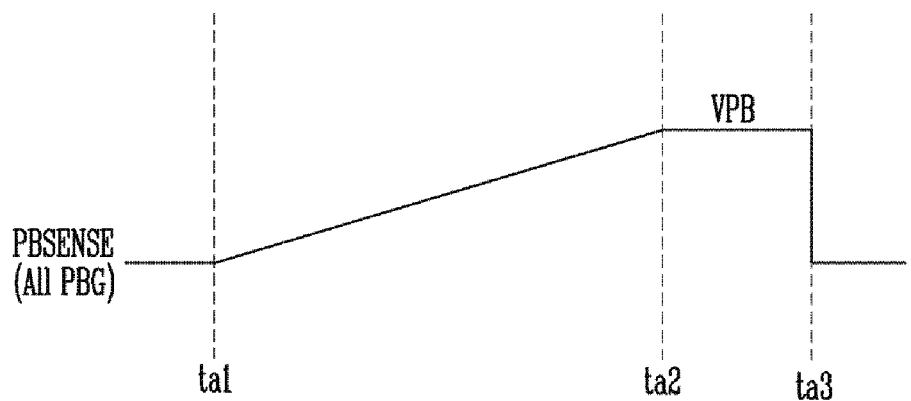
FIG. 11 is a diagram illustrating a bit line precharge operation according to an embodiment.

FIG. 11 is a diagram illustrating a bit line precharge operation according to an embodiment.

Referring to FIGS. 9 and 11, a plurality of page buffer control signals PBSENSE1 to PBSENSE4 respectively corresponding to a plurality of page buffer groups PBG1 to PBG4 may be applied to the page buffer groups PBG1 to PBG4.

In FIG. 11, the plurality of page buffer control signals PBSENSE1 to PBSENSE4 may be identical to each other as a page buffer control signal PBSENSE. That is, the same page buffer control signal PBSENSE may be applied to all of the plurality of page buffer groups All PBG.

During a period from a time point ta1 to a time point ta2, the page buffer control signal PBSENSE having a constant slope may be applied to all of the plurality of page buffer groups All PBG.

For example, during the period from the time point ta1 to the time point ta2, the page buffer control signal PBSENSE may increase from a low level to the level of the control voltage VPB while having a constant slope.

During a period from the time point ta2 to a time point ta3, the page buffer control signal PBSENSE having the level of the control voltage VPB may be applied to all of the plurality of page buffer groups All PBG.

Depending on the level of the page buffer control signal PBSENSE, the magnitude of a voltage that is transferred to the bit line may be adjusted. As the level of the page buffer control signal PBSENSE becomes higher, the magnitude of the voltage that is transferred to the bit line may increase, and thus the bit line precharge speed may increase. However, as the bit line precharge speed becomes higher, the quantity of electric charge stored for the same time may increase, and thus the amount of peak current generated in each page buffer group may also increase.

During an initial period of the bit line precharge operation in which the potential of each bit line rapidly increases, power consumption may be high, and during the latter period of the bit line precharge operation in which the potential of the bit line gently increases, power consumption may be low.

In the case of the bit line precharge operation of FIG. 10, the page buffer control signal PBSENSE may make a rapid transition from the low level to the level of the control voltage VPB at the time point t1, and may be maintained at the level of the control voltage VPB during the period from the time point t1 to the time point t3.

As illustrated in FIG. 10, when the page buffer control signal PBSENSE having the level of the control voltage VPB is applied to all of the plurality of page buffer groups All PBG during the initial period from t1 to t2 of the bit line precharge operation, power consumption of all of the plurality of page buffer groups All PBG may rapidly increase, and thus a peak current exceeding a threshold value may be generated.

In the case of the bit line precharge operation of FIG. 11, the page buffer control signal PBSENSE may make a gentle transition from the low level to the level of the control voltage VPB while having a constant slope during the period from the time point ta1 to the time point ta2. The page buffer control signal PBSENSE may be maintained at the level of the control voltage VPB during a period from the time point ta2 to the time point ta3.

As illustrated in FIG. 11, when the page buffer control signal PBSENSE having a constant slope is applied to all of the plurality of page buffer groups All PBG during the initial period from ta1 to ta2 of the bit line precharge operation, power consumption of all of the plurality of page buffer groups All PBG may gently increase, and thus the generation of a peak current exceeding a threshold value may be prevented.

In various embodiments, the value of the slope may be adjusted to prevent the generation of a peak current.

As the value of the slope is smaller, generation of a peak current may be more effectively prevented. However, the value of the slope may be in inverse proportion to the time required for a bit line precharge operation. In other words, as the time required for the bit line precharge operation is lengthened, the magnitude of the peak current may be decreased, but the entire programming time may be lengthened. As the time required for the bit line precharge operation is shortened, the length of the entire programming time may be shortened, but the magnitude of the peak current may be increased.

Figure 12:
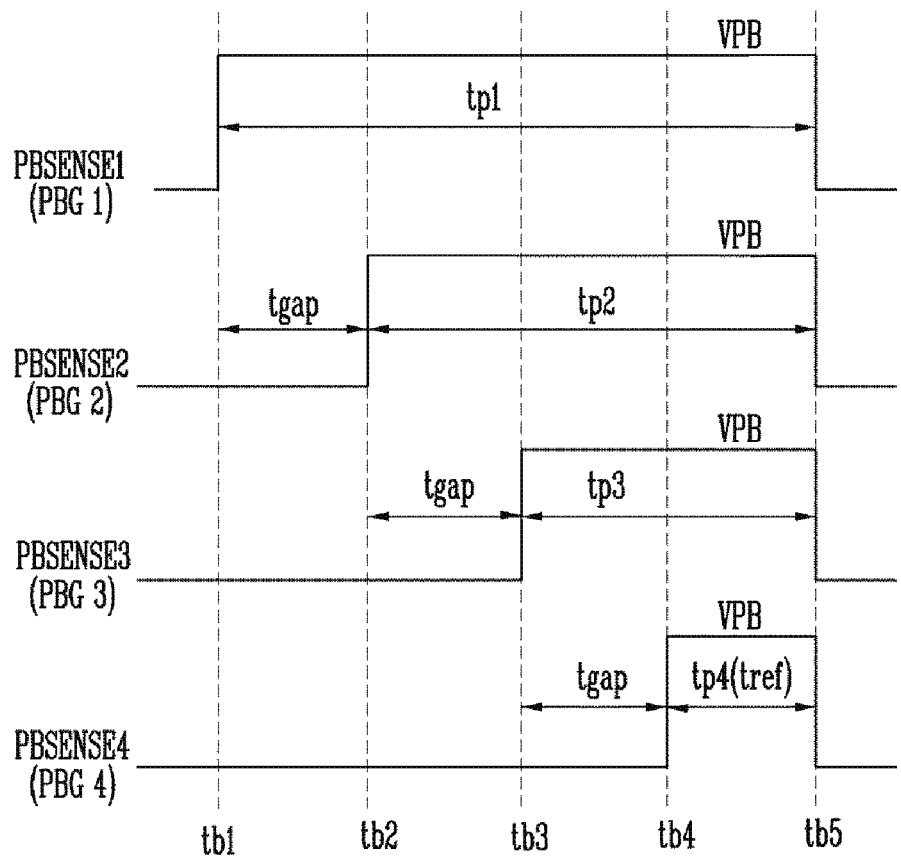
FIG. 12 is a diagram illustrating a bit line precharge operation according to an embodiment.

FIG. 12 is a diagram illustrating a bit line precharge operation according to an embodiment.

Referring to FIGS. 9 and 12, during a bit line precharge operation, a plurality of page buffer control signals PBSENSE1 to PBSENSE4 respectively corresponding to a plurality of page buffer groups PBG1 to PBG4 may be applied to the page buffer groups PBG1 to PBG4.

A first page buffer control signal PBSENSE1, which is activated to the level of a control voltage VPB during a period from a time point tb1 to a time point tb5, may be applied to the first page buffer group PBG1. A time point at which the first page buffer control signal PBSENSE1 is activated may be the time point tb1. The first page buffer group PBG1 may perform a first bit line precharge operation during a period tp1. An initiation time point of the first bit line precharge operation may be the time point tb1.

A second page buffer control signal PBSENSE2, which is activated to the level of the control voltage VPB during a period from a time point tb2 to the time point tb5, may be applied to the second page buffer group PBG2. A time point at which the second page buffer control signal PBSENSE2 is activated may be the time point tb2. The second page buffer group PBG2 may perform a second bit line precharge operation during a period tp2. An initiation time point of the second bit line precharge operation may be the time point tb2.

A third page buffer control signal PBSENSE3, which is activated to the level of the control voltage VPB during a period from a time point tb3 to the time point tb5, may be applied to the third page buffer group PBG3. A time point at which the third page buffer control signal PBSENSE3 is activated may be the time point tb3. The third page buffer group PBG3 may perform a third bit line precharge operation during a period tp3. An initiation time point of the third bit line precharge operation may be the time point tb3.

A fourth page buffer control signal PBSENSE4, which is activated to the level of the control voltage VPB during a period from a time point tb4 to the time point tb5, may be applied to the fourth page buffer group PBG4. A time point at which the fourth page buffer control signal PBSENSE4 is activated may be the time point tb4. The fourth page buffer group PBG4 may perform a fourth bit line precharge operation during a period tp4. An initiation time point of the fourth bit line precharge operation may be the time point tb4.

The length of the shortest period tp4, among the plurality of periods tp1 to tp4, may be fixed at a default value tref. The default value tref may be the minimum time required to precharge the potential of the bit line to a set level. The plurality of periods tp3, tp2, and tp1 may be sequentially increased from the shortest period tp4 by tgap.

"tgap" may be the interval between the initiation time points of respective bit line precharge operations. Alternatively, "tgap" may be the interval between time points at which respective page buffer control signals are activated.

In an embodiment, during an initial period of the bit line precharge operation in which the potential of each bit line rapidly increases, power consumption may be high, and during the latter period of the bit line precharge operation in which the potential of the bit line gently increases, power consumption may be low.

In the case of FIG. 10, the page buffer control signal PBSENSE, which is activated to the level of the control voltage VPB during the period from the time point t1 to the time point t3, may be applied to all of the plurality of page buffer groups All PBG. All of the page buffer groups All PBG may simultaneously initiate the bit line precharge operations. In this case, since initial periods of bit line precharge operations of all of the page buffer groups All PBG, which has high power consumption, overlap each other, power consumption may rapidly increase, and thus a peak current exceeding a threshold value may be generated.

Apart from the embodiments of FIG. 10, FIG. 12 shows that respective page buffer groups PBG1 to PBG4 may initiate bit line precharge operations at different time points. The generation of a peak current may be prevented by prohibiting the initial periods of the bit line precharge operations, which have high power consumption between respective bit line precharge operations, from overlapping each other.

In FIG. 12, the period from the time point tb1 to the time point tb4 may correspond to the period from the time point t1 to the time point t2 of FIG. 10. The period from the time point tb4 to the time point tb5 may correspond to the period from the time point t2 to the time point t3 of FIG. 10. Therefore, in comparison with the embodiments of FIG. 10, there is an advantage in that, even if the time required for the bit line precharge operation is identical to that of FIG. 10, the generation of a peak current may be prevented.

In the case of FIG. 11, during the period from the time point ta1 to the time point tat, a ramp signal-type page buffer control signal PBSENSE having a constant slope may be applied to all of the plurality of page buffer groups All PBG. In the case of FIG. 11, a separate ramp circuit may be required in a memory device to generate the ramp signal-type page buffer control signal PBSENSE.

In the case of FIG. 12, since square wave-type page buffer control signals PBSENSE1 to PBSENSE4 are applied to the plurality of page buffer groups PBG1 to PBG4, the potentials of the bit lines may be more rapidly increased than that of FIG. 11 for the same time. Therefore, in comparison with the embodiments of FIG. 11, there is an advantage in that the time required for the bit line precharge operation is shortened while the generation of a peak current is prevented.

In the case of FIG. 12, the square wave-type page buffer control signal may be generated using only a simpler and smaller transistor switch than the ramp circuit, and thus a layout area of the memory device may be improved.

Figure 13:
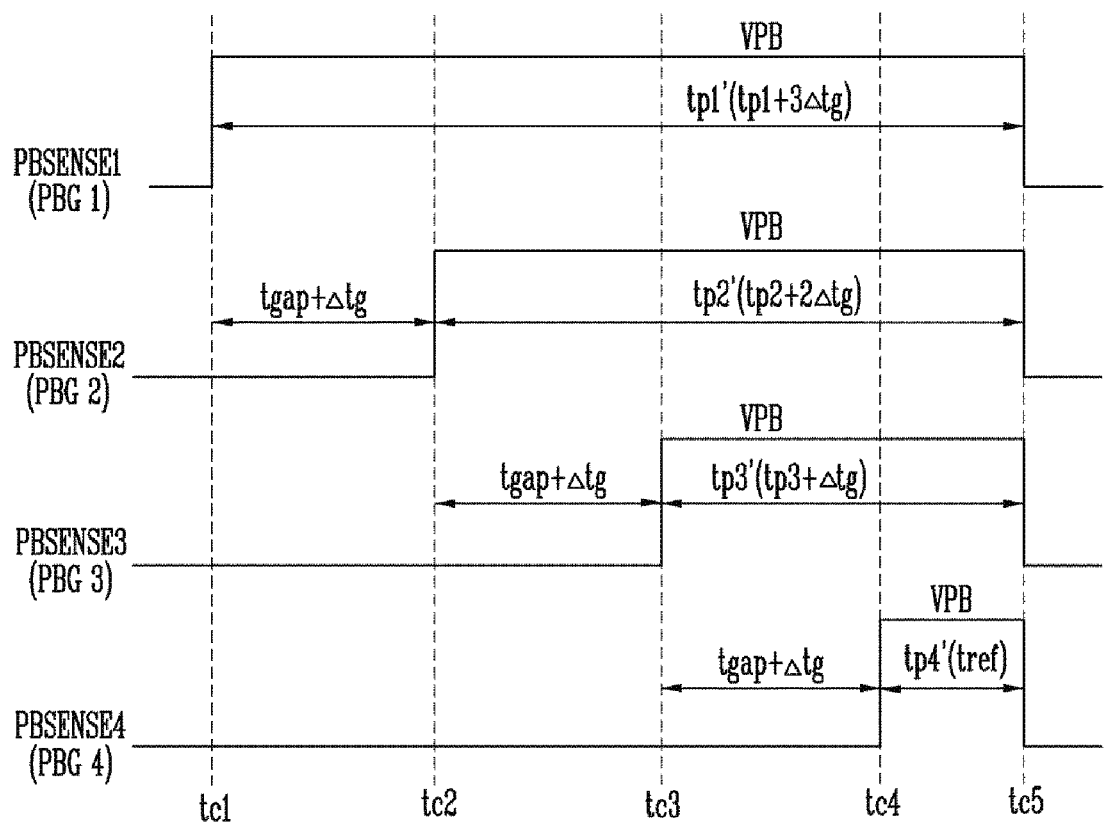
FIG. 13 is a diagram illustrating an operation of adjusting an interval between initiation time points of the bit line precharge operation of FIG. 12.

FIG. 13 is a diagram illustrating an operation of adjusting an interval between initiation time points of the bit line precharge operations of FIG. 12.

Referring to FIG. 13, the interval between the initiation time points of the bit line precharge operations may be adjusted from tgap to tgap+$\Delta$tg. $\Delta$ may have a positive value or a negative value. In FIG. 13, a description will be made on the assumption that $\Delta$ has a positive value.

A first page buffer control signal PBSENSE1, which is activated to the level of a control voltage VPB during a period from a time point tc1 to a time point tc5, may be applied to a first page buffer group PBG1. The time point at which the first page buffer control signal PBSENSE1 is activated may be the time point tc1. The first page buffer group PBG1 may perform a first bit line precharge operation during a period tp1'. An initiation time point of the first bit line precharge operation may be the time point tc1.

A second page buffer control signal PBSENSE2, which is activated to the level of the control voltage VPB during a period from a time point tc2 to the time point tc5, may be applied to the second page buffer group PBG2. The time point at which the second page buffer control signal PBSENSE2 is activated may be the time point tc2. The second page buffer group PBG2 may perform a second bit line precharge operation during a period tp2'. An initiation time point of the second bit line precharge operation may be the time point tc2.

A third page buffer control signal PBSENSE3, which is activated to the level of the control voltage VPB during a period from a time point tc3 to the time point tc5, may be applied to the third page buffer group PBG3. The time point at which the third page buffer control signal PBSENSE3 is activated may be the time point tc3. The third page buffer group PBG3 may perform a third bit line precharge operation during a period tp3'. An initiation time point of the third bit line precharge operation may be the time point tc3.

A fourth page buffer control signal PBSENSE4, which is activated to the level of the control voltage VPB during a period from a time point tc4 to the time point tc5, may be applied to the fourth page buffer group PBG4. A time point at which the fourth page buffer control signal PBSENSE4 is activated may be the time point tc4. The fourth page buffer group PBG4 may perform a fourth bit line precharge operation during a period tp4'. An initiation time point of the fourth bit line precharge operation may be the time point tc4.

The length of the shortest period tp4, among the plurality of periods tp1' to tp4, may be fixed at a default value tref. The default value tref may be the minimum time required to precharge the potential of the bit line to a set level. The plurality of periods tp3, tp2, and tp1' may be sequentially increased from the shortest period tp4' by tgap+$\Delta$tg.

Referring to FIG. 7, as bit line loading is larger, the time required for the bit line precharge operation may be lengthened, whereas as bit line loading is smaller, the time required for the bit line precharge operation may be shortened.

Therefore, it may be efficient to variably set the time required for the bit line precharge operation in consideration of bit line loading rather than uniformly setting the time required for the bit line precharge operation during the entire program operation period. The time required for the bit line precharge operation in the period having small bit line loading may be set to a time shorter than that in the period having large bit line loading, thereby shortening the entire program operation time.

In an embodiment, the interval between the initiation time points of bit line precharge operations may be adjusted depending on bit line loading. For example, the interval between the initiation time points of bit line precharge operations may be adjusted depending on the progress of the program operation. Bit line loading may be predicted based on the progress of the program operation.

When the interval between the initiation time points of the bit line precharge operations is adjusted, the lengths of periods of the bit line precharge operations may also be adjusted.

For example, when the interval between the initiation time points of bit line precharge operations is adjusted from tgap to tgap+Δtg, the lengths of periods of the bit line precharge operations may be respectively adjusted from tp1 through tp4 to tp1' through tp4'.

When the progress of the program operation has reached the time point ta, described above with reference to FIG. 7, the interval between the initiation time points of the bit line precharge operations may increase. That is, the value of Δ may increase. When the value of A increases, the lengths of periods of the bit line precharge operations respectively performed by the plurality of page buffer groups may also increase.

When the progress of the program operation has reached the time point tb, described above with reference to FIG. 7, the interval between the initiation time points of the bit line precharge operations may decrease. That is, the value of A may decrease. When the value of A decreases, the lengths of periods of the bit line precharge operations respectively performed by the plurality of page buffer groups may also decrease.

Figure 14:
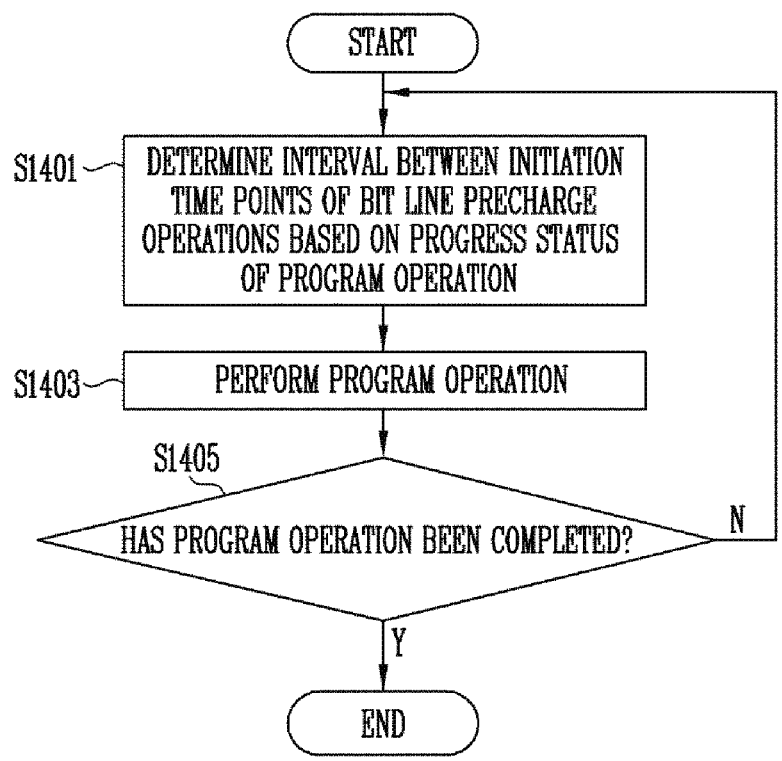
FIG. 14 is a flowchart illustrating a program operation according to an embodiment.

FIG. 14 is a flowchart illustrating a program operation according to an embodiment.

Referring to FIG. 14, at step S1401, an interval (time gap) between initiation time points of bit line precharge operations may be determined based on the progress of a program operation.

The progress of the program operation may indicate a point up to which programming has been performed in the entire period of the program operation. The progress of the program operation may be a program loop count, as described above with reference to FIG. 4, or may be a highest program state, among states for which or a program verify operation has passed, as described above with reference to FIG. 5.

The interval between the initiation time points of bit line precharge operations, respectively performed by a plurality of page buffer groups, described above with reference to FIG. 9, may be adjusted depending on the progress of the program operation, as described above with reference to FIG. 13.

At step S1403, a program operation including a program voltage apply operation and a program verify operation may be performed on a plurality of memory cells. During the program voltage apply operation, the bit line precharge operation of precharging a plurality of bit line groups coupled to the plurality of memory cells may be performed. The bit line precharge operations respectively performed by the plurality of page buffer groups may be performed based on the determined interval between the initiation time points.

At step S1405, whether the program operation has been completed may be determined. When it is determined that the program operation has been completed, the process is terminated, whereas when it is determined that the program operation has not been completed, the process returns to step S1401.

For example, when the plurality of memory cells have passed the program verify operation for all of states to be programmed, it may be determined that the program operation has been completed. When the plurality of memory cells have failed in the program verify operation for at least one of states to be programmed, it may be determined that the program operation has not been completed.

Figure 15:
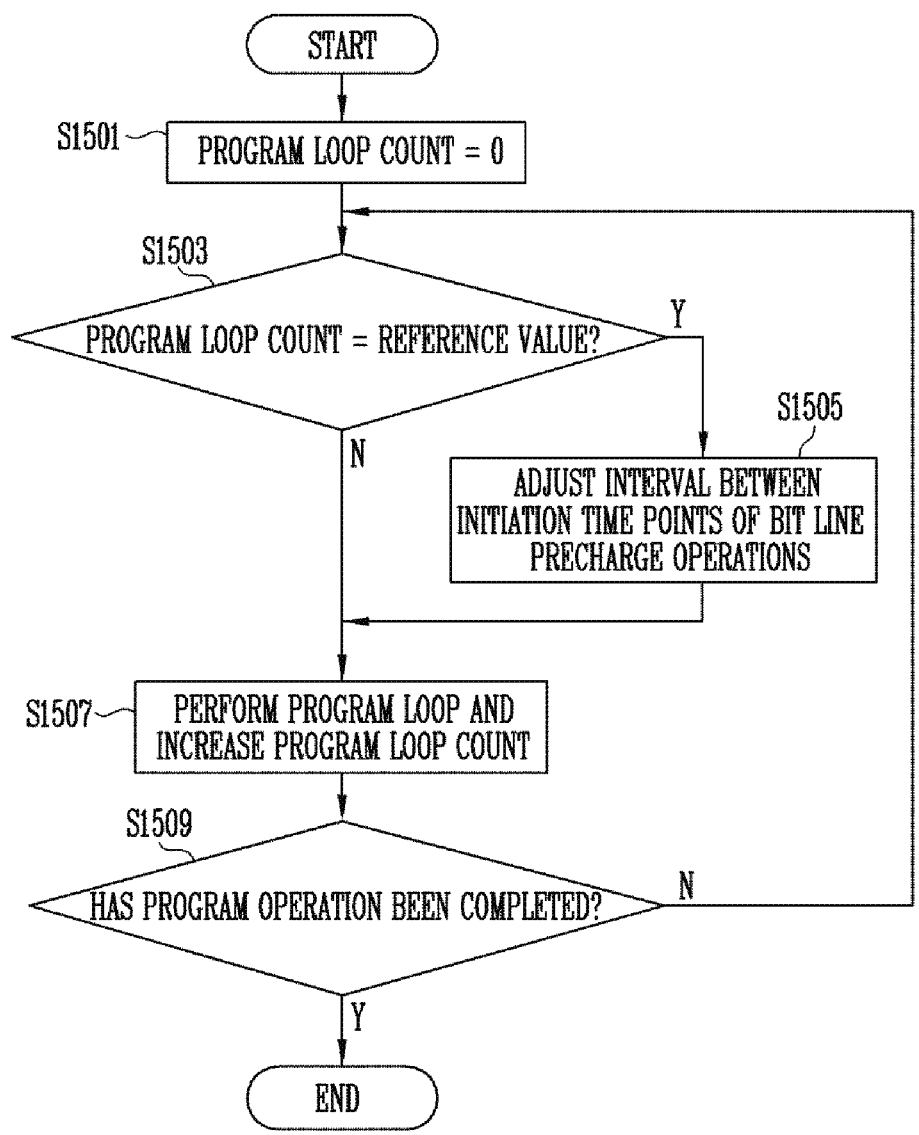
FIG. 15 is a flowchart illustrating the program operation of FIG. 14 according to an embodiment.

FIG. 15 is a flowchart illustrating the program operation of FIG. 14 according to an embodiment.

Referring to FIG. 15, at step S1501, a program loop count may be set to '0'.

At step S1503, whether the program loop count is identical to a reference value may be determined. The reference value may include one or more reference values. When the program loop count is equal to the reference value, the process proceeds to step S1505, whereas when the program loop count is different from the reference value, the process proceeds to step S1507. When the process proceeds to step S1505, a previous reference value may be changed to a next reference value, among the one or more reference values.

At step S1505, the interval between the initiation time points of bit line precharge operations may be adjusted. At step S1503, the progress of the program operation may be determined based on the results of a comparison between the program loop count and the reference values. As described above with reference to FIG. 13, the interval between the initiation time points of the bit line precharge operations respectively performed by a plurality of page buffer groups may be adjusted depending on the progress of the program operation.

At step S1507, as the program loop progresses, the program loop count may increase. Each program loop may include a program voltage apply operation and a program verify operation. During the program voltage apply operation, the bit line precharge operation may be performed. The bit line precharge operations respectively performed by the plurality of page buffer groups may be performed based on the adjusted interval between the initiation time points.

At step S1509, whether the program operation has been completed may be determined. When it is determined that the program operation has been completed, the process is terminated, whereas when it is determined that the program operation has not been completed, the process returns to step S1503. Determination about whether the program operation has been completed may be performed in a way similar to that of step S1405. However, when the program loop count exceeds the preset maximum number of times, the program operation may be processed as a failure, and the process may be terminated.

FIG. 16 is a flowchart illustrating the program operation of FIG. 14 according to an embodiment.

Referring to FIG. 16, at step S1601, n may be set to '1'.

At step S1603, whether a verify-passed program state is identical to a reference state may be determined. The reference state may include one or more reference states. When the verify-passed program state is identical to the reference state, the process proceeds to step S1605, whereas when the verify-passed program state is different from the reference state, the process proceeds to step S1607. When the process proceeds to step S1605, a previous reference state may be changed to a next reference state, among the one or more reference states.

At step S1605, the interval between the initiation time points of bit line precharge operations may be adjusted. At step S1603, the progress of the program operation may be determined based on the results of a comparison between the verify-passed program state and the reference states. As described above with reference to FIG. 13, the interval between the initiation time points of the bit line precharge operations respectively performed by a plurality of page buffer groups may be adjusted depending on the progress of the program operation.

At step S1607, a program pulse apply operation may be performed on a plurality of memory cells to be programmed to a program state corresponding to any one of first to k-th states (where k is a natural number of 1 or more). During the program pulse apply operation, the bit line precharge operation may be performed. The bit line precharge operations respectively performed by the plurality of page buffer groups may be performed based on the adjusted interval between the initiation time points.

At step S1609, a program verify operation for an n-th state may be performed.

For example, the program verify operation may be performed on memory cells to be programmed to the n-th state, among the first to k-th states. When all of the memory cells to be programmed to the n-th state are read as off-cells using a verify voltage corresponding to the n-th state, the memory cells may pass the program verify operation for the n-th state. When at least one of the memory cells to be programmed to the n-th state is read as an on-cell using the verify voltage corresponding to the n-th state, the memory cells may fail in the program verify operation for the n-th state.

At step S1611, whether the program verify operation, performed at step S1609, has passed may be determined. When it is determined that the program verify operation has passed, the process proceeds to step S1613, whereas when it is determined that the program verify operation has failed, the process returns to step S1607.

At step S1613, whether the program operation has been completed may be determined. When it is determined that the program operation has been completed, the process is terminated, whereas when it is determined that the program operation has not been completed, the process returns to step S1615.

When all of the program verify operations for the first to k-th states have passed, it may be determined that the program operation has been completed. When the program verify operation for at least one of the first to k-th states has failed, it may be determined that the program operation has not been completed.

At step S1615, n may be increased by '1'.

In accordance with the present disclosure, there are provided a memory device having improved bit line precharge performance and a method of operating the memory device.

What is claimed is:

1. A memory device, comprising:
 a page including a plurality of memory cells coupled to a word line;
 a plurality of page buffers coupled to the plurality of memory cells through a plurality of bit lines, respectively and divided into a plurality of page buffer groups each including at least two page buffers among the plurality of page buffers; and
 a program operation controller configured to control the plurality of page buffers to perform bit line precharge operations initiated at different time points for each page buffer group among the plurality of page buffer groups during a program operation on the page,
 wherein the program operation controller increases intervals between the time points at which the bit line precharge operations are initiated by the plurality of page buffer groups at a first timing during the program operation and decreases the intervals between the time points at which the bit line precharge operations are initiated by the plurality of page buffer groups at a second timing during the program operation.

2. The memory device according to claim 1, wherein:
 the program operation controller provides a plurality of page buffer control signals that are activated at different time points to each of the plurality of page buffer groups, and
 the plurality of page buffer groups perform the bit line precharge operations in response to the plurality of page buffer control signals, respectively.

3. The memory device according to claim 2, further comprising a peripheral circuit configured to perform the program operation,
 wherein the peripheral circuit comprises the plurality of page buffer groups, and performs a program voltage apply operation on the plurality of memory cells to be programmed to any one of first to n-th program states and a program verify operation for at least one of the first to n-th program states, where n is a natural number.

4. The memory device according to claim 3, wherein:
 the program operation controller determines the first timing and the second timing depending on a progress of the program operation.

5. The memory device according to claim 4, wherein the progress of the program operation corresponds to a highest program state for which the program verify operation has passed, among the first to n-th program states.

6. The memory device according to claim 5, wherein the program operation controller adjusts the intervals between based on a result of a comparison between the highest program state and one or more reference states.

7. The memory device according to claim 6, wherein the first timing corresponds to a time the when the highest program state is equal to or higher than a first reference state, among the one or more reference states.

8. The memory device according to claim 7, wherein the second timing corresponds to a time when the highest program state is equal to or higher than a second reference state different from the first reference state, among the one or more reference states.

9. The memory device according to claim 4, wherein:
 the peripheral circuit performs one or more program loops, each including the program voltage apply operation and the program verify operation, and
 the progress of the program operation is determined based on a program loop count indicating a number of program loops that are performed during the program operation.

10. The memory device according to claim 9, wherein the program operation controller adjusts the intervals between based on a result of a comparison between the program loop count and one or more reference values.

11. The memory device according to claim 10, wherein the first timing corresponds to a time when the program loop count is equal to or greater than a first reference value, among the one or more reference values.

12. The memory device according to claim 11, wherein the second timing corresponds to a time when the program loop count is equal to or greater than a second reference value different from the first reference value, among the one or more reference values.

13. The memory device according to claim 12, wherein the second reference value is greater than the first reference value.

14. The memory device according to claim 1, wherein a length of a shortest period, among periods during which the bit line precharge operations are performed, is fixed at a default value, and wherein, the default value is a minimum time required to precharge a potential of a bit line to a set value.

15. A method of operating a memory device, the memory device performing a program operation on a plurality of memory cells coupled to a plurality of page buffers through a plurality of bit lines respectively which are divided into a plurality of page buffer groups the method comprising:

determining intervals between time points at which precharging of the plurality of bit lines is initiated by the plurality of page buffer groups;

performing bit line precharge operations to precharge the plurality of bit lines coupled to the plurality of memory cells initiated at different time points for each page buffer group among the plurality of page buffer groups; and performing program voltage applying operations to apply a program voltage to a word line coupled to the plurality of memory cells after the bit line precharge operations, wherein the intervals are increased at a first timing in the program operation and decreased at a second timing in the program operation, and wherein each of the page buffer groups includes at least two page buffers among the plurality of page buffers.

16. The method according to claim 15, wherein the program operation comprises one or more program loops, and each of the one or more program loops comprises the program voltage applying operation on the plurality of memory cells to be programmed to any one of first to n-th program states and a program verify operation for at least one of the first to n-th program states, where n is a natural number.

17. The method according to claim 16, wherein the first timing and second timing are determined
depending on a progress of the program operation.

18. The method according to claim 17, wherein the progress of the program operation corresponds to a highest program state for which the program verify operation has passed, among the first to n-th program states, where n is a natural number.

19. The method according to claim 18, wherein the intervals are increased or decreased based on a result of a comparison between the highest program state and one or more reference states.

20. The method according to claim 17, wherein the progress of the program operation is determined based on a program loop count indicating a number of program loops that are performed during the program operation.

21. The method according to claim 18, wherein the intervals are increased or decreased based on a result of a comparison between the program loop count and one or more reference values.

22. The method according to claim 15, wherein a length of a shortest period, among periods during which the bit line precharge operations are performed, is fixed at a default value.

* * * * *